(12) United States Patent
Granger-Jones (10) Patent No.: US 8,749,296 B2
(45) Date of Patent: *Jun. 10, 2014

(54) SOI SWITCH ENHANCEMENT

(71) Applicant: RF Micro Devices, Inc., Greensboro, NC (US)

(72) Inventor: Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,992

(22) Filed: May 13, 2013

(65) Prior Publication Data

US 2013/0249619 A1 Sep. 26, 2013

Related U.S. Application Data

(62) Division of application No. 12/880,634, filed on Sep. 13, 2010, now Pat. No. 8,461,903.

(60) Provisional application No. 61/241,683, filed on Sep. 11, 2009.

(51) Int. Cl.
*H03K 17/687* (2006.01)

(52) U.S. Cl.
USPC .......................................... 327/427

(58) Field of Classification Search
USPC .................. 327/427, 434, 437, 392
See application file for complete search history.

(56) References Cited

U.S. PATENT DOCUMENTS

| | | | |
|---|---|---|---|
| 4,317,055 A | 2/1982 | Yoshida et al. | |
| 5,382,826 A | 1/1995 | Mojaradi et al. | |
| 6,803,680 B2 * | 10/2004 | Brindle et al. | 307/115 |
| 7,459,988 B1 | 12/2008 | Iversen | |
| 8,461,903 B1 * | 6/2013 | Granger-Jones | 327/427 |

OTHER PUBLICATIONS

Kelly, D. et al., "The state-of-the-art of silicon-on-sapphire CMOS RF switches," IEEE 2005 Compound Semiconductor Integrated Circuit Symposium, Oct. 30-Nov. 2, 2005, pp. 200-203.
Shifrin, M.B. et al., "Monolithic FET structures for high-power control component applications," IEEE Transactions on Microwave Theory and Techniques, Dec. 1989, pp. 2134-2141, vol. 37, No. 12.
Tinella, C. et al., "0.13/spl mu/rn CMOS SOI SP6T antenna switch for multi-standard handsets," 2006 Topical Meeting on Silicon Monolithic Integrated Circuits in RF Systems, Jan. 18-20, 2006, pp. 58-61.
Non-Final Office Action for U.S. Appl. No. 12/880,634, mailed Aug. 10, 2012, 5 pages.
Final Office Action for U.S. Appl. No. 12/880,634, mailed Nov. 26, 2012, 8 pages.
Notice of Allowance for U.S. Appl. No. 12/880,634, mailed Feb. 12, 2013, 7 pages.

* cited by examiner

*Primary Examiner* — Hai L Nguyen
(74) *Attorney, Agent, or Firm* — Withrow & Terranova, P.L.L.C.

(57) ABSTRACT

The described FET switch topology greatly reduces the off state loading experienced by the gate biasing resistors in a stacked FET structure. The FET switch topology evenly distributes the voltage across the FET switch topology which reduces the voltage across the gate biasing resistors when the stacked FET structure is in an off state. Because the off state loading is reduced, there is a corresponding reduction of the current through bias resistors, which permits a reduction in the size of the bias resistors. This permits a substantial reduction in the area attributed to the bias resistors in an integrated solution.

16 Claims, 10 Drawing Sheets

SOI SWITCH ENHANCEMENT

RELATED APPLICATIONS

This application is a divisional of U.S. patent application Ser. No. 12/880,634 filed Sep. 13, 2010, now U.S. Pat. No. 8,461,903 which was issued on Jun. 11, 2013. The Ser. No. 12/880,634 application claims the benefit of provisional application No. 61/241,683 filed Sep. 11, 2009. The disclosures of these applications are each hereby incorporated herein by reference in their entirety.

FIELD OF THE DISCLOSURE

This application relates to biasing a stacked shunt switch. The application further relates to biasing a stacked silicon on insulator (SOI) switch.

BACKGROUND

Figure 1:
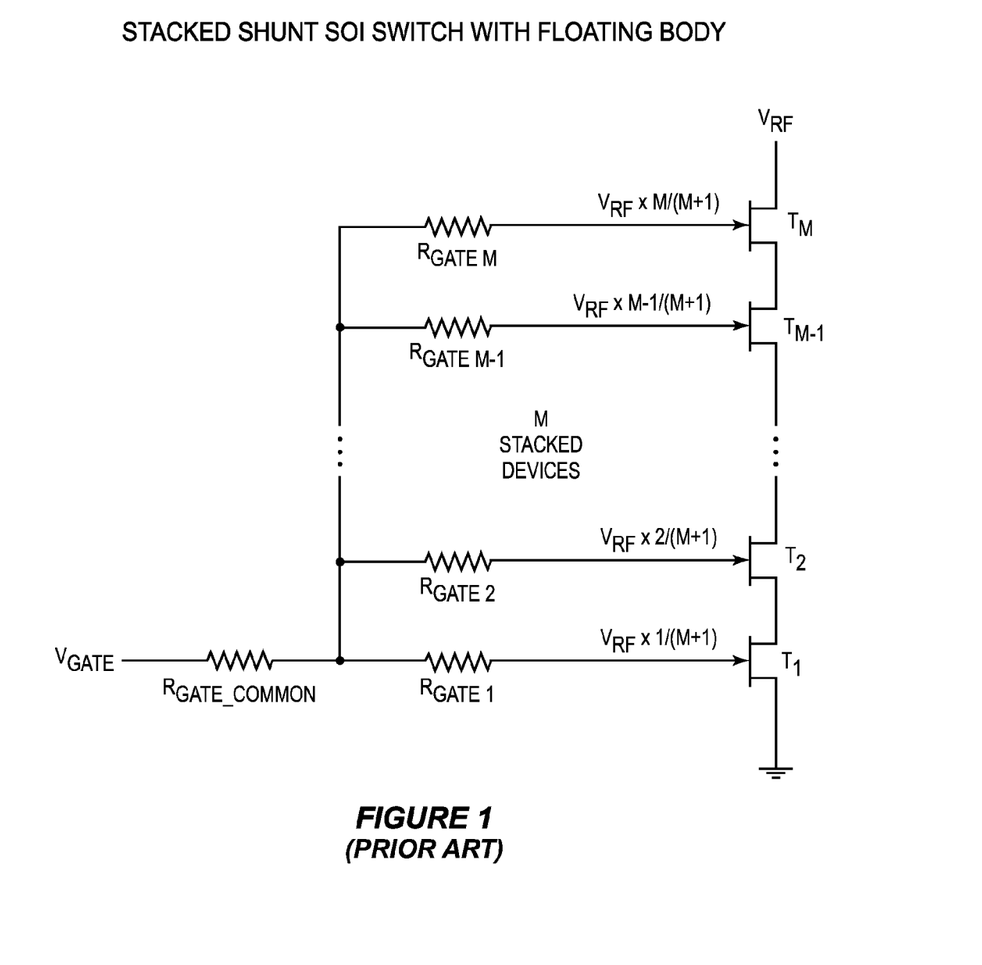
FIG. 1 depicts a prior art switch with a floating body.
Figure 2:
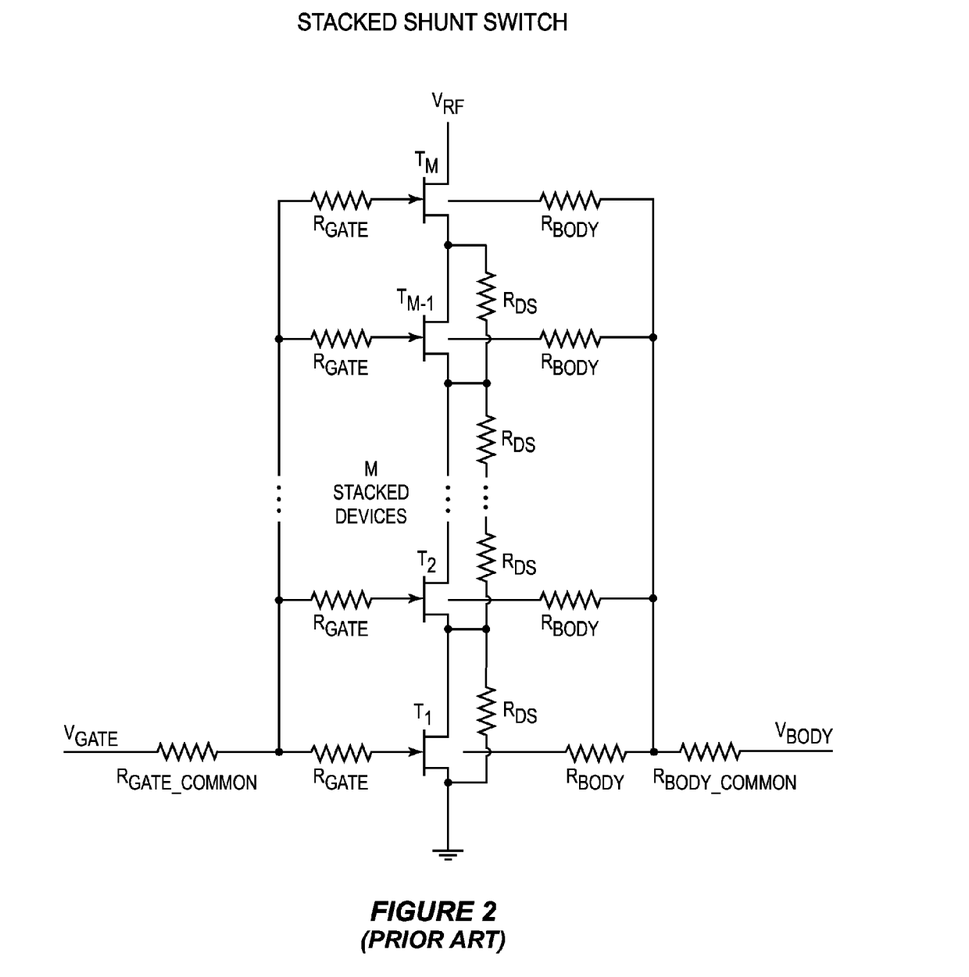
FIG. 2 depicts the prior art switch further applicable to bulk technologies.
Figure 3:
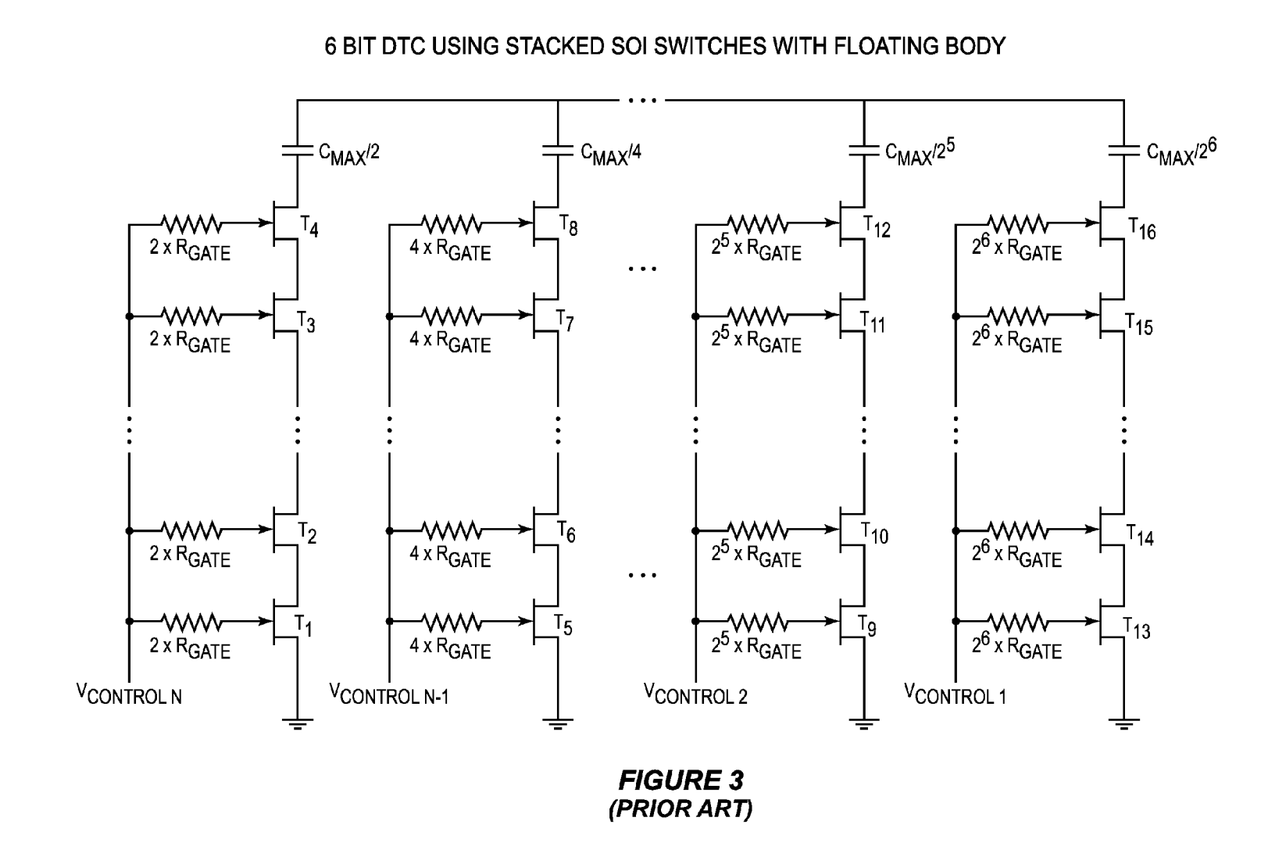
FIG. 3 depicts the circuitry of FIG. 2 further including drain-source resistors.

The prior art for a biasing arrangement of base and body contacts for a stacked shunt switch is depicted in FIGS. 1, 2, and 3. FIG. 1 depicts the gate connections for a stacked SOI switch using floating bodies. FIG. 2 depicts the gate and body biasing connections for a stacked structure and is applicable to both SOI and bulk technologies. FIG. 3 is similar to FIG. 2 but further includes drain-source resistors.

In a front end switch design targeted at cellular applications, the number of stacked devices could easily exceed 10 and the value of the $R_{GATE}$, $R_{BODY}$ and $R_{DS}$ resistors may be greater than 50 kohm. The value of the $R_{GATE}$ and $R_{BODY}$ and $R_{DS}$ resistors are chosen to be high enough to give an even distribution of any RF signal across each of the transistors when the switch is in its 'off' state but also low enough to meet switching time requirements.

The problem with this approach comes with the resistors. As the switch is split into N segments, N resistors of value N times the value used in the original resistors in the switch design are needed. This can lead to a requirement for a large number of very high value resistors resulting in significant area penalties.

Accordingly, there is a need to develop a stacked SOI switch that permits the use of smaller valued resistors.

SUMMARY OF THE DETAILED DESCRIPTION

Embodiments in the detailed description include a serial stacked shunt semiconductor on insulator (SOI) switch series that distributes the drain-source voltage across each of the FET devices when the FET devices are in an off state.

An example serial stacked shunt semiconductor on insulator (SOI) switch includes a plurality of FET devices. Each FET device includes a gate contact, a drain contact, and a source contact. The plurality of FET devices are coupled in series to form a chain having a first drain at a first end of the chain, a first source coupled at a second end of the chain, and where the gate contact of the FET device at the second end of the chain is a first gate contact. A plurality of gate biasing circuits coupled in series, wherein each of the plurality of gate biasing circuits is coupled between a corresponding pair of gate contacts of the plurality of FET devices. In addition, a common biasing circuit has a first terminal and a second terminal, wherein the first terminal is coupled to the first gate contact.

One benefit of the serial stacked shunt SOI switch topology is that the off state loading of each gate biasing resistors in a stacked FET structure is substantially reduced. As a result, the values of the bias resistors may be substantially reduced. Because the value of a resistor on an integrated chip is directly related to surface area dedicated to the resistor, the reduction in the values of the bias resistors permits a substantial reduction in the area attributed to the bias resistors. The series stacked FET structure also has the added benefit of evenly distributing the drain-source voltage across each of the FET devices when the FET devices are in the off state.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The described devices, systems and methods include a topology that greatly reduces the off state loading caused by the gate biasing resistors in a stacked FET structure. In the off state, the gate and body are biased such that the FET is high impedance and any RF voltage seen on a drain node of the structure is evenly distributed across the gate-drain and gate-source voltages within the stacked structure.

Because the off state loading is reduced, there is a corresponding reduction of the current through the bias resistors that permits a reduction in the size of the bias resistors. This permits a substantial reduction in the area attributed to the bias resistors.

Figure 4:
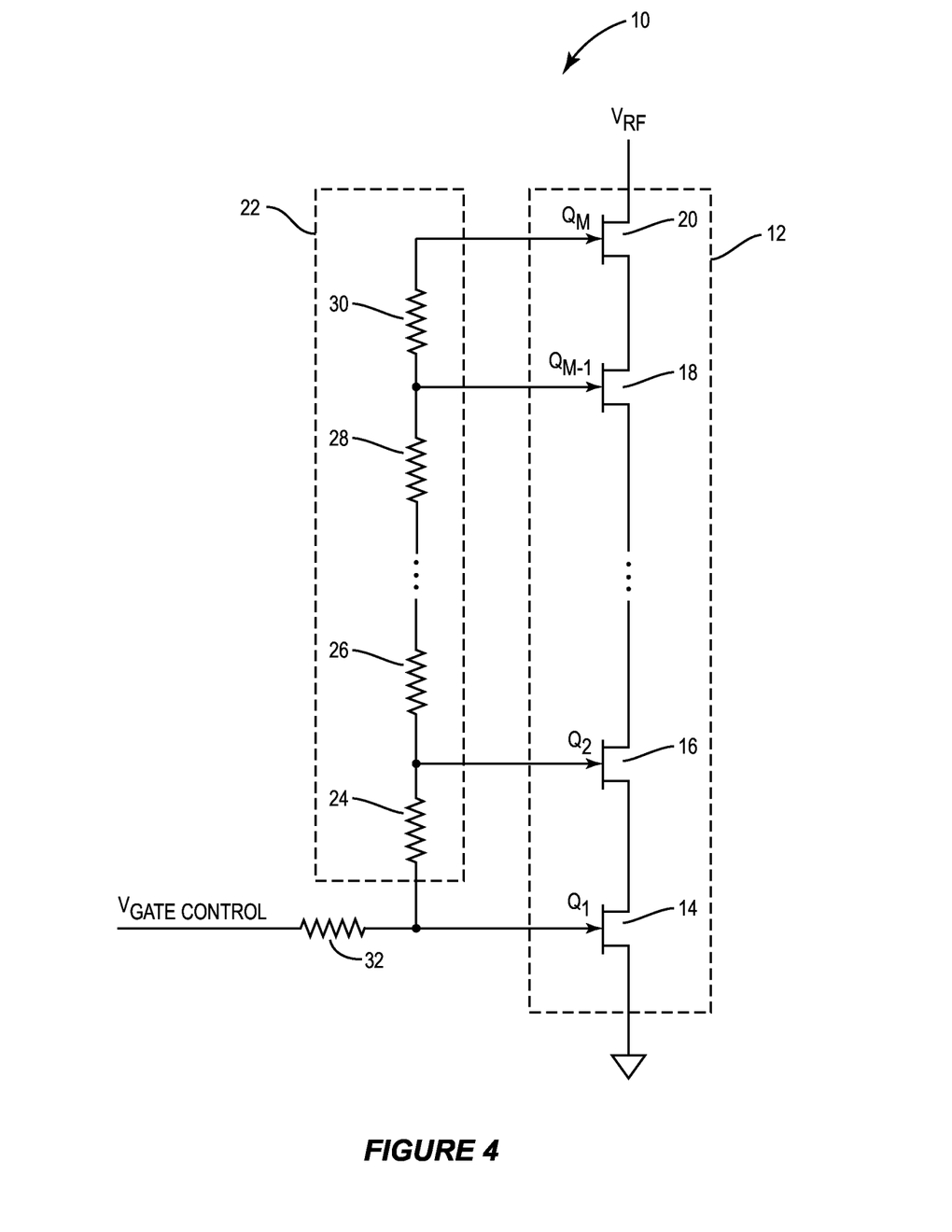
FIG. 4 depicts a series coupled SOI switch with a floating body.

As an example, FIG. 4 depicts a series coupled switch structure 10 having M number of FET transistors. Each of the FET transistors includes a gate, a source, and a drain. A chain of serially coupled transistors 12 is formed by a first FET ($Q_1$)

14, a second FET ($Q_2$) 16, an M-1$^{th}$ FET ($Q_{M-1}$) 18, and an M$^{th}$ FET ($Q_M$) 20. The chain of serially coupled transistors 12 may have a first drain, which is the drain of the M$^{th}$ FET ($Q_{M-1}$) 20. The chain of serially coupled transistors may have a first source and a first gate, which correspond to the source and gate of the first FET ($Q_1$). The first FET 14, second FET 16, M-1$^{th}$ FET 18, and M$^{th}$ FET 20 may be, for example, a silicon on insulator (SOI) FET transistor, a High Electron Mobility Transistor (HEMT), or a silicon on sapphire (SOS) FET transistor.

The series coupled switch structure 10 may further include a gate biasing circuitry 22. Each of the plurality of gates is coupled between a corresponding pair of gates of the first FET ($Q_1$) 14, the second FET ($Q_2$) 16, the M-1$^{th}$ FET ($Q_{M-1}$) 18, and the M$^{th}$ FET ($Q_M$) 20. For example, the first biasing circuit 24 is coupled between gates of the first FET 14 and the second FET 16. The second biasing circuit 26 is coupled between the gates of the second FET 16 and the next FET in the chain of serially coupled transistors 12. Likewise, the M-1$^{th}$ biasing circuit 28 is coupled between gates of the M-1$^{th}$ FET 18 and the proceeding transistor in the chain of serially coupled transistors 12. The M$^{th}$ biasing circuit 30 is coupled between the gates of the M-1$^{th}$ FET 18 and the M$^{th}$ FET 20. A common gate control common biasing circuit 32 includes a first terminal coupled to the gate of the first FET 14 and a $V_{GATE\ CONTROL}$ signal. The first biasing circuit 24, second biasing circuit 26, M-1$^{th}$ biasing circuit 28, and M$^{th}$ biasing circuit 30 and the common gate control biasing circuit 32 may each be a resistor.

Operationally, when the $V_{GATE\ CONTROL}$ signal is asserted, the chain of serially coupled transistors 12 are turned on. When the $V_{GATE\ CONTROL}$ signal is de-asserted, the chain of serially coupled transistors 12 are turned off.

The topology greatly reduces the off state loading caused by the gate biasing resistors in a stacked FET structure. In the off state, the gate and body are biased such that the series coupled switch structure 10 is high impedance and any RF voltage, $V_{RF}$, seen on the drain node of the series coupled switch structure 10 is evenly distributed across the gate-drain and gate-source voltages. The smaller resistors are possible because the voltage across the voltage in the stack is distributed evenly across the biasing circuits 22. As a result, the values of the first biasing circuit 24, second biasing circuit 26, M-1$^{th}$ biasing circuit 28, and M$^{th}$ biasing circuit 30 and the common gate control biasing circuit 32 have substantially less resistance required than the prior art. In some cases, the total surface area may be reduces by a ratio of 42:1. Accordingly, a substantial amount of die space may be saved.

As an example, referring to the prior art FIGS. 1-3, the typical values of the resistors $R_{GATE}$, $R_{BODY}$, and $R_{DS}$ for a high dynamic range front end switch may be on the order of 50 K ohms. Accordingly, a design with one prior art SOI switch having 14 transistors may require a total resistance of 2100 K ohms. In contrast, a similarly situated 14 transistor switch of FIG. 6 may have a total resistance of around 42 K ohms.

Figure 5:
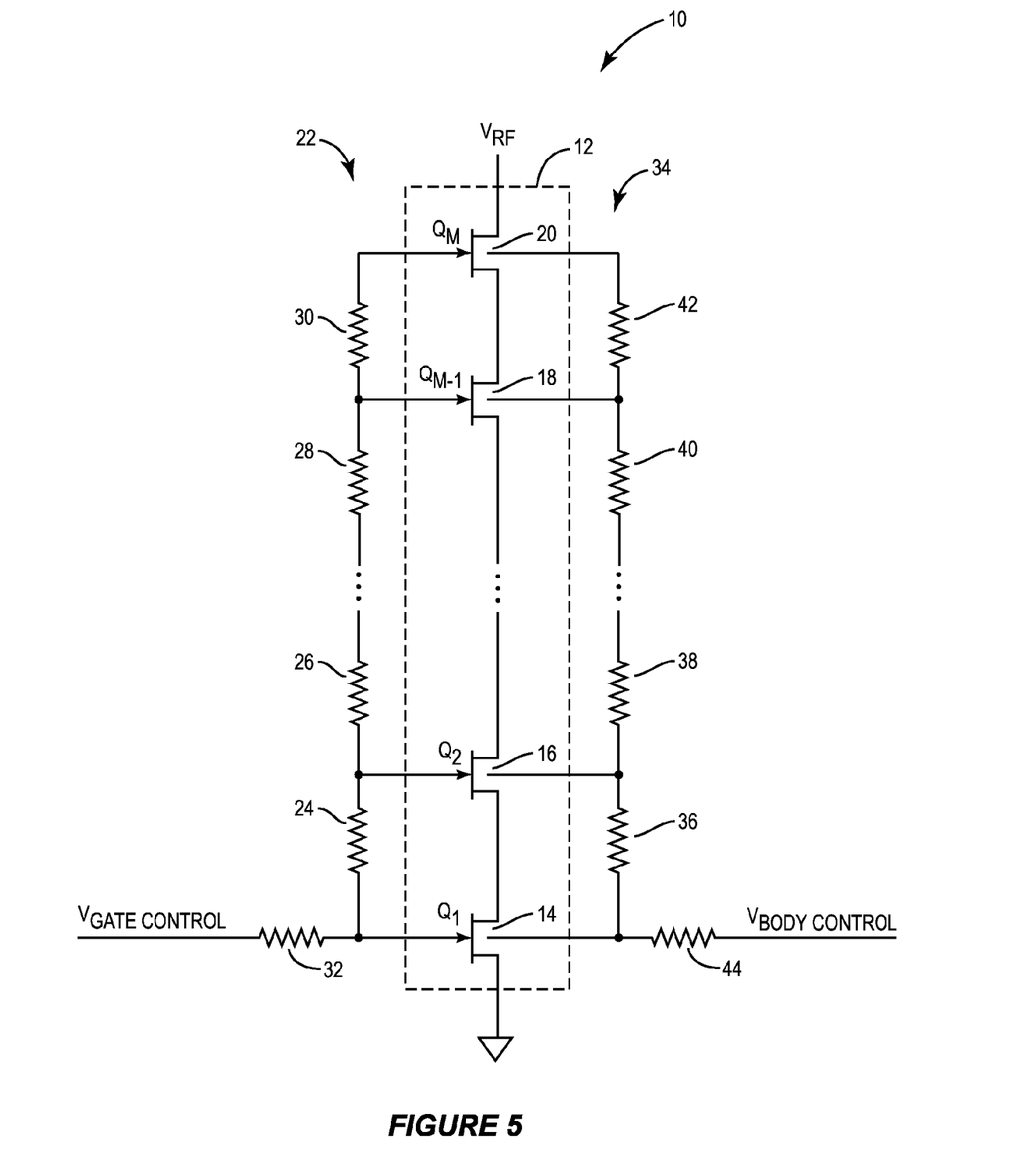
FIG. 5 depicts a series coupled SOI switch of FIG. 4 with body contacts.

FIG. 5 depicts the chain of serially coupled transistors 12, where the first FET 14, second FET 16, M-1$^{th}$ FET 18, and M$^{th}$ FET 20 include body connections. A second plurality of body biasing circuits 34 may include a first body biasing circuit 36, a second body biasing circuit 38, a M-1$^{th}$ body bias circuit 40, and an M$^{th}$ body biasing circuit 42. The first body biasing circuit 36 is coupled between the body contacts of the first FET 14 and the second FET 16. The second body biasing circuit 38 is coupled between the body contacts of the second FET 16 and the next FET in the chain of serially coupled transistors 12. Likewise, the M-1$^{th}$ body biasing circuit 40 is coupled between body contacts of the M-1$^{th}$ FET 18 and the proceeding transistor in the chain of serially coupled transistors 12. The M$^{th}$ body biasing circuit 42 is coupled between the body contacts of the M-1$^{th}$ FET 18 and the M$^{th}$ FET 20.

A common body control biasing circuit 44 includes a first terminal coupled to the body contact of the first FET 14 and a $V_{BODY\ CONTROL}$ signal. The first biasing circuit 24, second biasing circuit 26, M-1$^{th}$ biasing circuit 28, and M$^{th}$ biasing circuit 30 and the common gate control biasing circuit 32 may each be a resistor.

Figure 6:
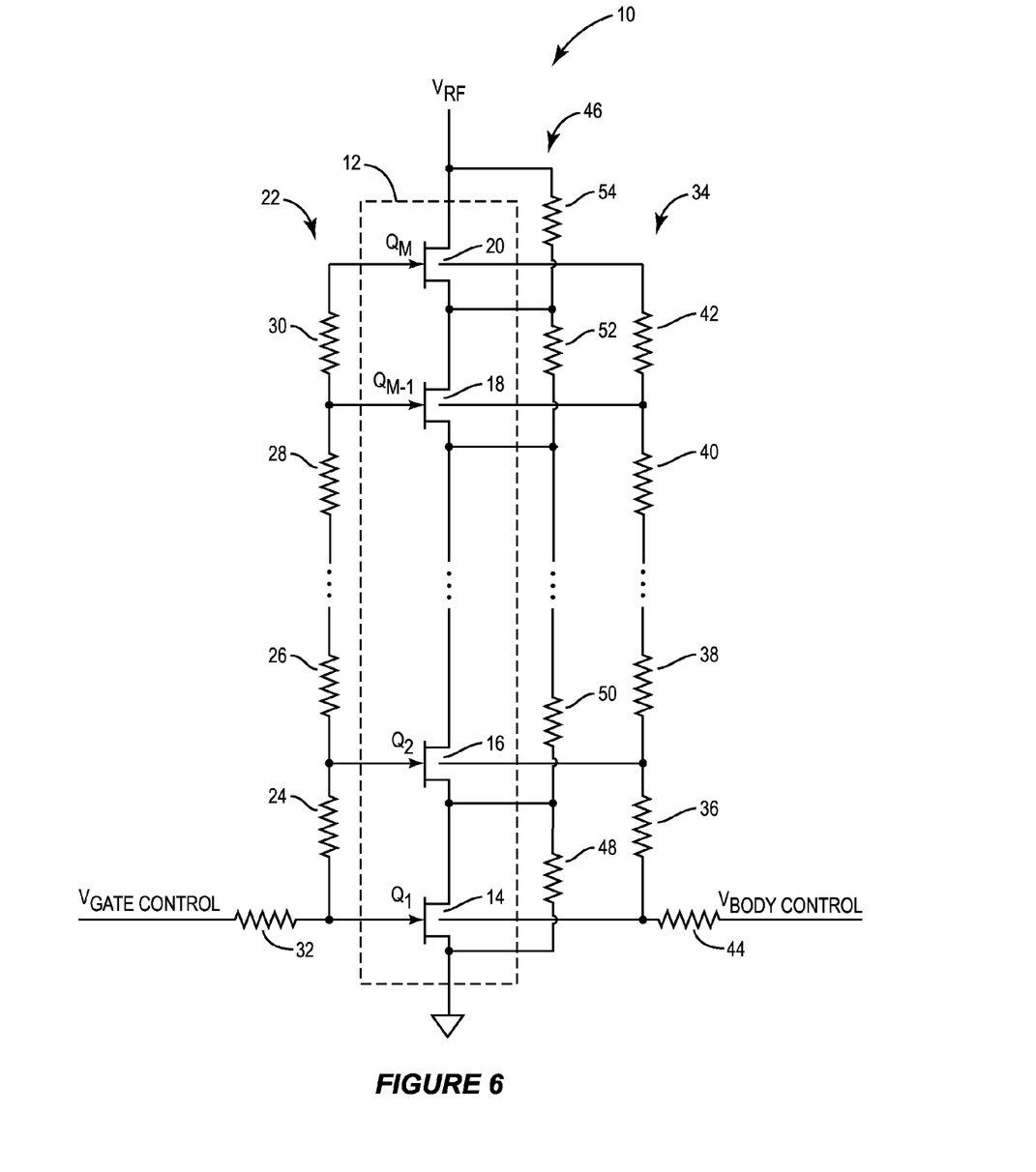
FIG. 6 depicts a series coupled SOI switch of FIG. 5 with drain-source resistors.

FIG. 6 depicts the chain of serially coupled transistors 12, where the first FET 14, second FET 16, M-1$^{th}$ FET 18, and M$^{th}$ FET 20 include body connections and a plurality of drain-source resistors 46. A first drain-source resistor 48 is coupled across the drain and source of the first FET 14. A second drain-source resistor 50 is coupled across the drain and source of the second FET 16. A M-1$^{th}$ drain-source resistor 52 is coupled across the drain and source of the M-1$^{th}$ transistor 18. An M$^{th}$ drain-source resistor 54 is coupled across the drain and source of the M$^{th}$ FET 20.

Figure 7:
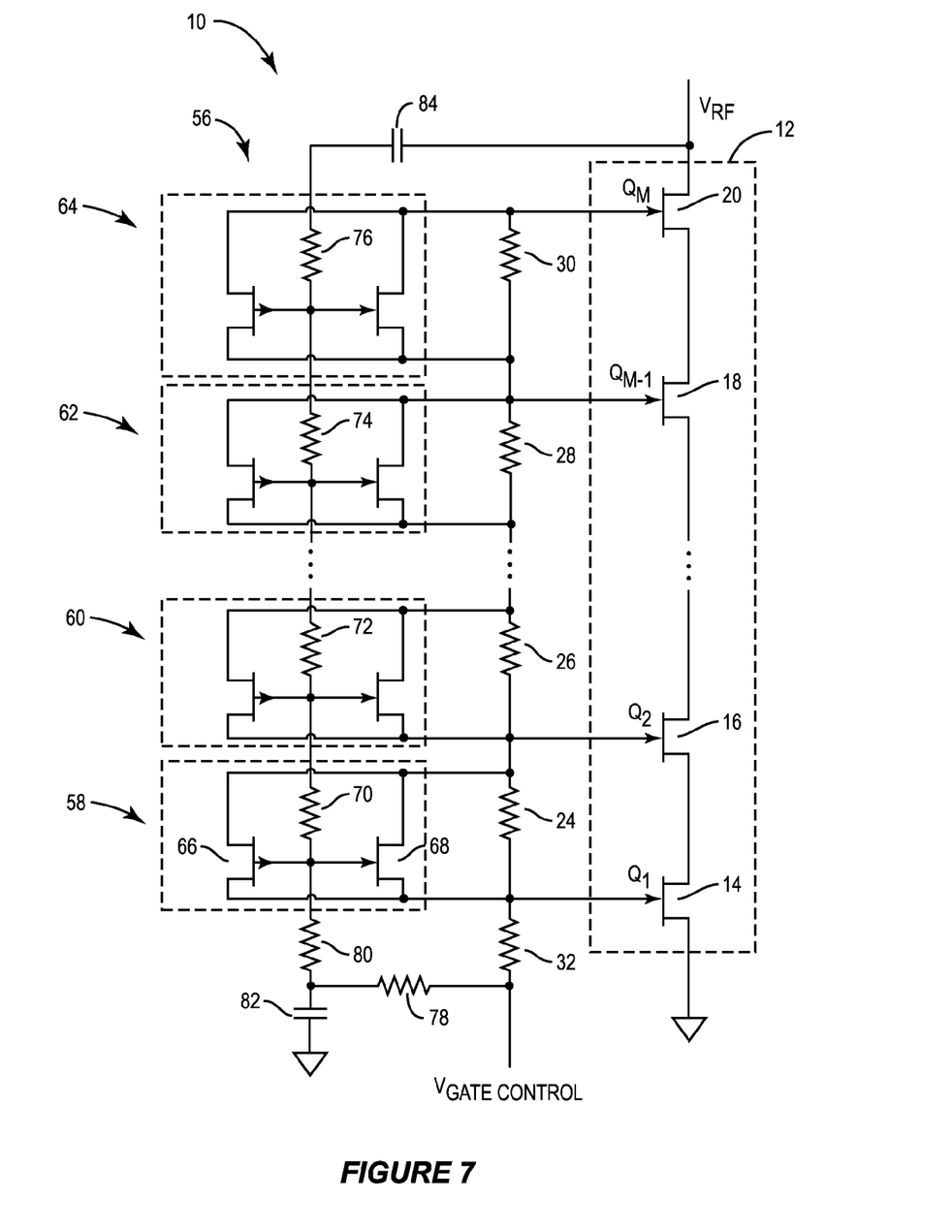
FIG. 7 depicts the series coupled SOI switch of FIG. 4 with speedup circuitry.

FIG. 7 depicts the series coupled switch structure 10 of FIG. 4 in combination with a plurality of serially coupled gate speedup circuits 56. The serially coupled gate speedup circuits 56 include a chain of speedup circuits consisting of a first speedup circuit 58, a second speedup circuit 60, a M-1$^{th}$ speedup circuit 62, and a M$^{th}$ speedup circuit 64. The first speedup circuit 58 is coupled across the first biasing circuit 24. The second speedup circuit 60 is coupled across the second biasing circuit 26. The M-1$^{th}$ speedup circuit 62 is coupled across the M-1$^{th}$ biasing circuit 28. The M$^{th}$ speedup circuit 64 is coupled across the M$^{th}$ biasing circuit 30.

As an exemplary speedup circuit, the first speedup circuit 58 includes a pFET transistor 66 coupled in parallel with an nFET transistor 68. The gate of the pFET transistor 66 is coupled to the gate of the nFET transistor 68. When the gates are turned on, the pFET transistor 66 and the nFET transistor 68 substantially create a very low impedance across the first biasing circuit 24.

The plurality of serially coupled gate speedup circuits 56 is serially coupled together by the first switch resistor 70, second switch resistor 72, third switch resistor 74, and fourth switch resistor 76.

The plurality of serially coupled gate speedup circuits 56 is coupled to the $V_{GATE\ CONTROL}$ signal via a first pulse resistor 78 and a second pulse resistor 80. The first pulse resistor 78 and the second pulse resistor 80 are coupled to ground through a first pulse capacitor 82. The fourth switch resistor 76 is coupled to the first drain, the drain of the M$^{th}$ FET 20, via a second pulse capacitor 84.

As an example, when the $V_{GATE\ CONTROL}$ signal transitions to the de-asserted state, the first speedup circuit 58 is momentarily turned on, which places a low impedance in parallel with the first biasing circuit 24. This permits the voltage on the gate of the second FET 16 to drop more rapidly and turn off the second gate. The drop in voltage on the gate of FET 16 then turns on the second speed up circuit 60, which places the low impedance in parallel with the second biasing circuit 26. This permits the voltage on the gate of the third FET in the stack to drop more rapidly and turn the third FET off. This rippling effect continues all the way up the stack of FET devices. After a period of time, the first pulse capacitor 82 and the second pulse capacitor 84 discharges, which causes the first speedup circuits 58, 60, 62, and 64 to turn off.

Figure 8:
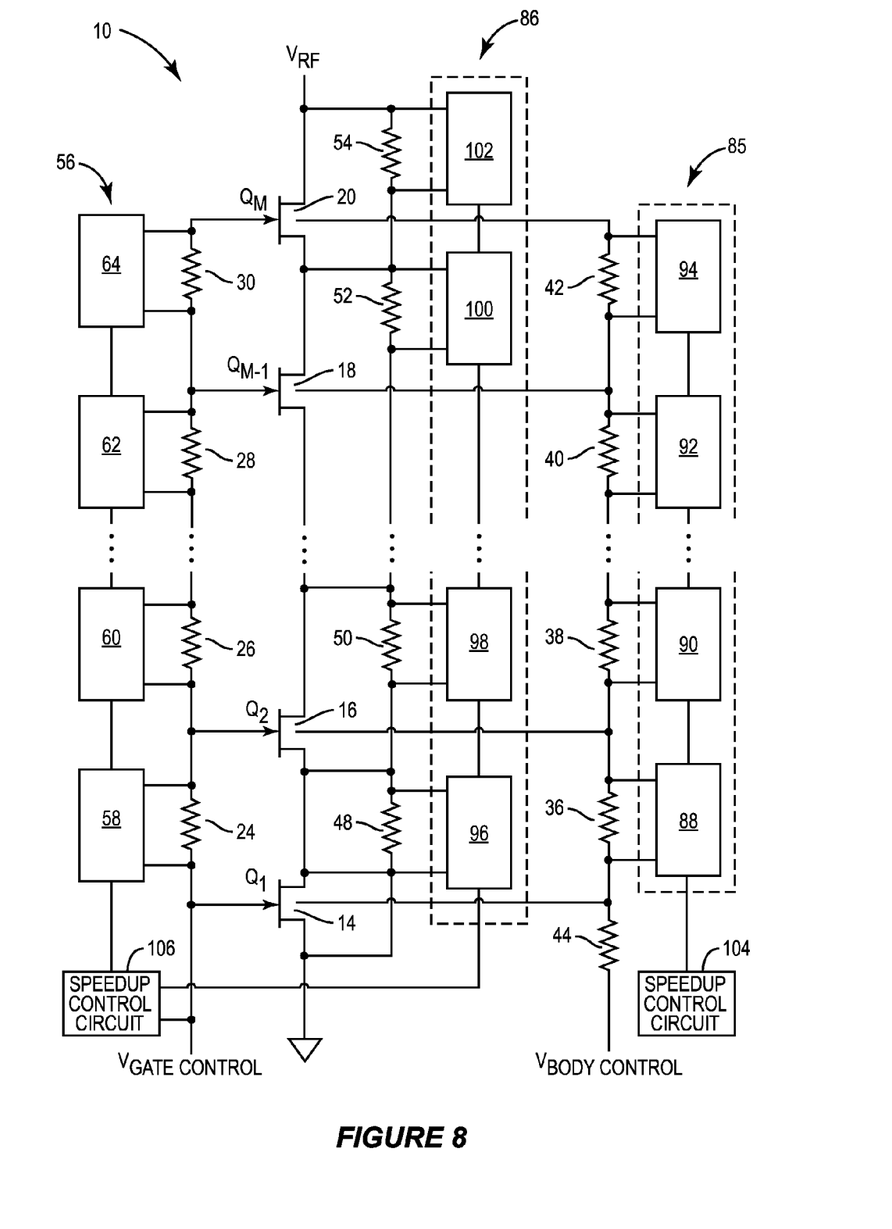
FIG. 8 depicts the series coupled switch of FIG. 6 with speedup circuitry.

FIG. 8 depicts a further example of a speedup circuit arrangement for the circuit of FIG. 6 with continuing reference to FIG. 7. As depicted in FIG. 7, FIG. 8 also depicts the plurality of serial coupled gate speedup circuits 56 across each of the plurality of biasing circuits 22. In addition, one of a plurality of serial coupled body speedup circuits 85 are coupled across each of the first body biasing circuit 36, the second body biasing circuit 38, the M-1$^{th}$ body bias circuit 40, and the M$^{th}$ body biasing circuit 42. Likewise, one of a plurality of serial coupled drain-source speed up circuits 86 may be coupled across each of the first drain-source resistor 48, the second drain-source resistor 50, the M-1$^{th}$ drain-source resistor 52, and the M$^{th}$ drain-source resistor 54.

Illustratively, a first body speedup circuit 88 is coupled across the first body biasing circuit 36. A second body speedup circuit 90 is coupled across the second body biasing circuit 38. An M-1$^{th}$ body speedup circuit 92 is coupled across the M-1$^{th}$ body bias circuit 40. An M$^{th}$ body speedup circuit 94 is coupled across the M$^{th}$ body biasing circuit 42. A first drain-source speedup circuit 96 is coupled across the first drain-source resistor 48. A second drain-source speedup circuit 98 is coupled across the second drain-source resistor 50. A M-1$^{th}$ speedup circuit 100 is coupled across the M-1$^{th}$ drain-source resistor 52. A M$^{th}$ speedup circuit 102 is coupled across the M$^{th}$ drain-source resistor 54. The plurality of various speedup circuits are controlled by the speedup control circuits 104 and 106.

Figure 9:
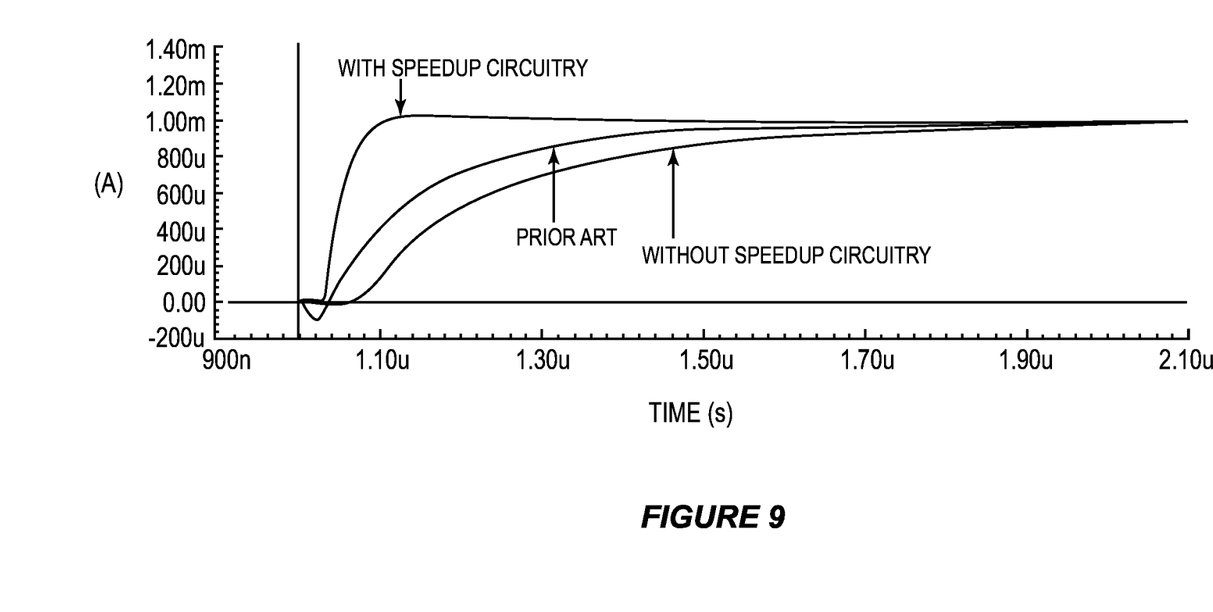
FIG. 9 depicts a switching speed comparison between the prior art, the series coupled SOI switch, and the series coupled SOI switch with speedup circuitry.

FIG. 9 depicts an example comparison in switching time between the prior art circuits, shown in FIGS. 1-3, and the series coupled switch structure 10 with and without the speedup circuits.

Figure 10:
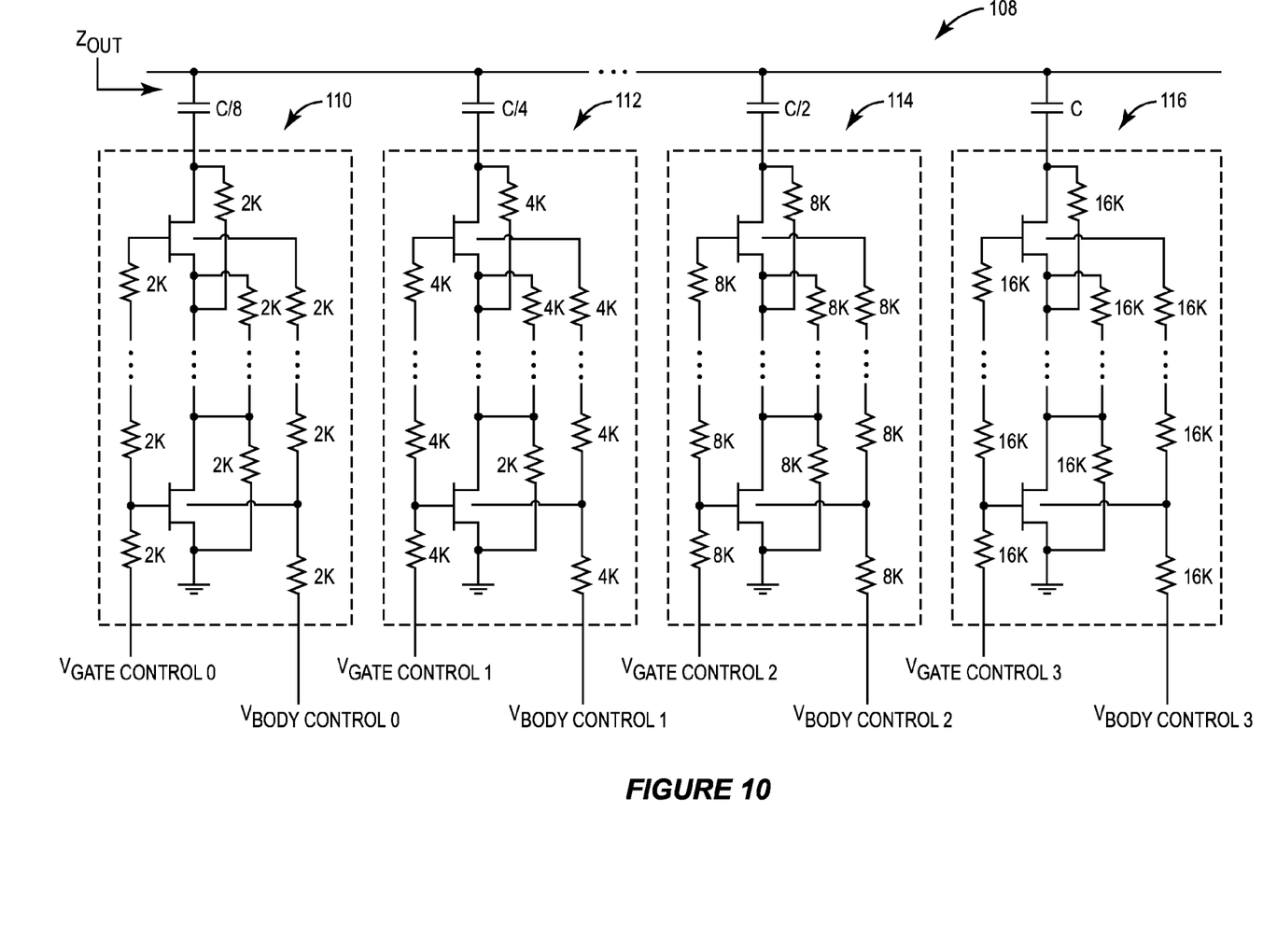
FIG. 10 depicts an example binary capacitor array.

FIG. 10 depicts an exemplary 4 bit binary digitally tunable capacitor DTC array 108 having four series coupled switch structures 110, 112, 114, and 116. Each of the series coupled switch structures includes 14 FET transistors (M=14). Assuming that each of the serially coupled transistors 12 is associated with three resistors, as shown in FIG. 10, the total resistance associated with the transistors would be a total of 630 Kohms of resistance. A similar structure using the prior art of FIG. 3 could require up to 45 Mohms of resistance.

Those skilled in the art will recognize improvements and modifications to the embodiments of the present disclosure. All such improvements and modifications are considered within the scope of the concepts disclosed herein and the claims that follow.

What is claimed is:

1. A serially stacked shunt semiconductor on insulator (SOI) switch comprising:
    a plurality of field effect transistor (FET) devices, wherein each FET device of the plurality of FET devices includes a gate contact, a drain contact, and a source contact, and such that the plurality of FET devices are coupled in series to form a chain having a first drain at a first end of the chain, a first source coupled to a second end of the chain, and wherein the gate contact of the FET device at the second end of the chain is a first gate contact;
    a plurality of gate biasing circuits coupled in series, wherein each one of the plurality of gate biasing circuits is coupled between a corresponding pair of gate contacts of the plurality of FET devices, and further wherein each one of the plurality of gate biasing circuits includes a resistor; and
    a plurality of gate speedup circuits, wherein each one of the plurality of gate speedup circuits is coupled across a corresponding gate biasing circuit of the plurality of gate biasing circuits.

2. The serially stacked shunt SOI switch of claim 1 wherein each one of the plurality of gate speedup circuits are coupled in series to form a chain having a first control node at a first end of the chain and a second control node coupled at a second end of the chain.

3. The serially stacked shunt SOI switch of claim 1 wherein each one of the plurality of gate speedup circuits is configured to shunt the corresponding one of the plurality of gate biasing circuits.

4. The serially stacked shunt SOI switch of claim 1 wherein each one of the plurality of gate speedup circuits comprises:
    a pFET transistor including a drain contact coupled to a first speedup node, a gate contact coupled to a second speedup node, and a source contact coupled to a third speedup node; and
    an nFET transistor including a drain contact coupled to the first speedup node, a gate contact coupled to the second speedup node, and a source contact coupled to the third speedup node.

5. The serially stacked shunt SOI switch of claim 4 wherein the plurality of gate speedup circuits are coupled together in series at the second speedup node of each one of the gate speedup circuits by a plurality of switch resistors such that a single switch resistor is coupled between each second speedup node of the plurality of gate speedup circuits.

6. The serially stacked shunt SOI switch of claim 1 further including a common biasing circuit having a first terminal and a second terminal, wherein the first terminal is coupled to the first gate contact.

7. A serially stacked shunt semiconductor on insulator (SOI) switch comprising:
    a plurality of field effect transistor (FET) devices, wherein each FET device of the plurality of FET devices includes a gate contact, a drain contact, and a source contact, and such that the plurality of FET devices are coupled in series to form a chain having a first drain at a first end of the chain, a first source coupled to a second end of the chain, and wherein the gate contact of the FET device at the second end of the chain is a first gate contact;
    a plurality of drain-source biasing circuits coupled in series, wherein each one of the plurality of drain-source biasing circuits is coupled between a corresponding drain contact and source contact of one of the plurality of FET devices, and further wherein each one of the plurality of drain-source biasing circuits includes a resistor; and
    a plurality of drain-source speedup circuits, wherein each one of the plurality of drain-source speedup circuits is coupled across a corresponding drain-source biasing circuit of the plurality of drain-source biasing circuits.

8. The serially stacked shunt SOI switch of claim 7 wherein each one of the plurality of drain-source speedup circuits are coupled in series to form a chain having a first control node at a first end of the chain and a second control node coupled at a second end of the chain.

9. The serially stacked shunt SOI switch of claim 7 wherein each one of the plurality of drain-source speedup circuits is configured to shunt the corresponding one of the plurality of drain-source biasing circuits.

10. The serially stacked shunt SOI switch of claim 7 wherein each one of the plurality of drain-source speedup circuits comprises:
    a pFET transistor including a drain contact coupled to a first speedup node, a gate contact coupled to a second speedup node, and a source contact coupled to a third speedup node; and
    an nFET transistor including a drain contact coupled to the first speedup node, a gate contact coupled to the second speedup node, and a source contact coupled to the third speedup node.

11. The serially stacked shunt SOI switch of claim 10 wherein the plurality of drain-source speedup circuits are coupled together in series at the second speedup node of each one of the plurality of drain-source speedup circuits by a plurality of switch resistors such that a single switch resistor is coupled between each second speedup node of the plurality of drain-source speedup circuits.

12. A serially stacked shunt semiconductor on insulator (SOI) switch comprising:
 a plurality of field effect transistor (FET) devices, wherein each FET device of the plurality of FET devices includes a gate contact, a drain contact, a source contact, and a body contact, and such that the plurality of FET devices are coupled in series to form a chain having a first drain at a first end of the chain, a first source coupled to a second end of the chain, and wherein the body contact of the FET device at the second end of the chain is a first body contact;
 a plurality of body biasing circuits coupled in series, wherein each one of the plurality of body biasing circuits is coupled between the body contact of a corresponding FET device and the body contact of an adjacent FET device, and further wherein each one of the plurality of body biasing circuits includes a resistor; and
 a plurality of body speedup circuits, wherein each one of the plurality of body speedup circuits is coupled across a corresponding body biasing circuit of the plurality of body biasing circuits.

13. The serially stacked shunt SOI switch of claim 12 wherein each one of the plurality of body speedup circuits are coupled in series to form a chain having a first control node at a first end of the chain and a second control node coupled at a second end of the chain.

14. The serially stacked shunt SOI switch of claim 12 wherein each one of the plurality of body speedup circuits is configured to shunt the corresponding one of the plurality of body biasing circuits.

15. The serially stacked shunt SOI switch of claim 12 wherein each one of the plurality of body speedup circuits comprises:
 a pFET transistor including a drain contact coupled to a first speedup node, a gate contact coupled to a second speedup node, and a source contact coupled to a third speedup node; and
 an nFET transistor including a drain contact coupled to the first speedup node, a gate contact coupled to the second speedup node, and a source contact coupled to the third speedup node.

16. The serially stacked shunt SOI switch of claim 15 wherein the plurality of body speedup circuits are coupled together in series at the second speedup node of each one of the plurality of body speedup circuits by a plurality of switch resistors such that a single switch resistor is coupled between each second speedup node of the plurality of body speedup circuits.

\* \* \* \* \*